United States Patent
Kinoshita

[19]

[11] Patent Number: 6,150,850

[45] Date of Patent: Nov. 21, 2000

[54] CHOPPER TYPE COMPARATOR

[75] Inventor: Masakuni Kinoshita, Yokohama, Japan

[73] Assignee: Texas Instruments Incorporated, Dallas, Tex.

[21] Appl. No.: 09/295,731

[22] Filed: Apr. 20, 1999

[30] Foreign Application Priority Data

Apr. 20, 1998 [JP] Japan ................................. 10-109965

[51] Int. Cl.⁷ ................................................ H03K 5/153
[52] U.S. Cl. .............................................. 327/77; 327/337
[58] Field of Search ............................ 330/9, 51; 327/63, 327/77, 91, 93, 94, 96, 337, 124

[56] References Cited

U.S. PATENT DOCUMENTS 5,936,434  8/1999  Kumamoto et al. ...................... 327/77
5,973,517  9/1999  Kurauchi et al. ......................... 327/77

*Primary Examiner*—Toan Tran
*Assistant Examiner*—Paul Dinh
*Attorney, Agent, or Firm*—William B. Kempler; Frederick J. Telecky, Jr.

[57] ABSTRACT

A chopper type comparator has one terminal of a first capacitor C1 connected to a connecting point P of a first switch SW1 and a second switch SW2, and an analog input signal $A_{IN}$ and a reference voltage $V_{REF}$ are supplied in an alternating fashion. The first capacitor C1, first inverter INV1, second capacitor C2, second inverter INV2, and third inverter INV3 are connected in series in this order. The input and output terminals of the first inverter INV1 are connected via a third switch SW3, and both terminals of the second capacitor C2 are connected via a fifth switch SW5. The input and output terminals of the second inverter INV2 are connected via a fourth switch SW4. The second capacitor 2 can be reset in a short time by the fourth and fifth switches SW4 and SW5.

6 Claims, 7 Drawing Sheets

CHOPPER TYPE COMPARATOR

FIELD OF THE INVENTION

The present invention pertains to a chopper type comparator.

BACKGROUND OF THE INVENTION

A half-flash type analog/digital converter is equipped with a comparator, encoder, voltage divider, etc.

FIG. 1 is a constitutional diagram showing an example of a conventional half-flash type analog/digital converter.

The half-flash type analog/digital converter has: a voltage divider that receives voltages $V_{RS}$ and $V_{RT}$ and generates reference voltages for comparison by dividing the differential voltage; chopper type comparator groups 106–108 for comparing reference voltages from the voltage divider 105 and analog input signals $A_{IN}$; an encoder 103 for outputting digital signals $D_{LSB0}$ of the least significant bit side based on the output result of the chopper type comparator group 106; an encoder 102 for outputting digital signals $D_{LSB1}$ of the least significant bit side based on the output result of the chopper type comparator group 107; and digital signals $D_{MSB}$ of the most significant bit side based on the output result of the chopper type comparator group 108.

The voltage divider 105 has resistors $R_1$–$R_m$ connected in series for dividing the voltages $V_{RB}$ and $V_{RT}$.

Resistors $r_{11}$–$r_{1n}$ and $r_{1n+1}$, connected in series for further dividing the terminal voltage of the resistor $R_1$, are connected in parallel with resistor $R_1$.

Resistors $r_{21}$–$r_{2n}$ and $r_{2n+1}$, connected in series for further dividing the terminal voltage of the resistor $R_2$, are connected in parallel with resistor $R_2$.

The resistors $R_3$–$R_{m-1}$ are also similar.

Resistors $r_{m1-rmn}$ and $r_{mn+1}$, connected in series for further dividing the terminal voltage of the resistor $R_m$, are connected in parallel with resistor $R_m$.

One terminal of the resistor $r_{M1}$ is connected to one terminal of the resistor $R_M$, and the other terminal of the resistor $r_{M1}$ is connected to the inverting input terminal of a chopper type comparator $C_{11}$ via a switching means $S_{M1}$.

One terminal of the resistor $r_{M2}$ is connected to the other terminal of the resistor $R_{M1}$, and the other terminal of the resistor $r_{M2}$ is connected to the inverting input terminal of a chopper type comparator $C_{12}$ via a switching means $S_{M2}$.

The resistors $r_{M3}$–$r_{Mn-1}$ are also similar.

One terminal of the resistor $r_{Mn}$ is connected to the other terminal of the resistor $r_{Mn-1}$, and the other terminal of the resistor $r_{Mn}$ is connected to the inverting input terminal of the chopper type comparator $C_{1n}$ via the switching means $S_{Mn}$, where $1 \leq M \leq m$, and M and m are integers of 2 or higher.

The inverting input terminals of the chopper type comparators $C_{11}$–$C_{1n}$ and the inverting input terminals of the chopper type comparators $C_{m1}$–$C_{mn}$ are respectively connected.

The analog input signal $A_{IN}$ is supplied to the non-inverting input terminal of the chopper type comparators $C_{11}$–$C_{1n}$, $C_{m1}$–$C_{mn}$, and $C_{R1}$–$C_{Rm}$.

One terminal of the resistors $R_1$–$R_m$ is respectively connected to the inverting input terminals of the chopper type comparators $C_{R1}$–$C_{Rm}$.

The chopper type comparator groups 106 and 107 respectively have the chopper type comparators $C_{11}$–$C_{1n}$ and $C_{m1-Cmn}$ of the least significant bit side.

The chopper type comparator group 108 has the chopper type comparator $C_{R1}$–$C_{Rm}$ of the most significant bit side.

The switching means $S_{11}$–$S_{1n}$, etc., $S_{m1}$–$S_{mn}$ of the voltage divider 105 are controlled based on the outputs of the chopper type comparators $C_{R1}$–$C_{Rm}$ of the most significant bit side.

For example, in case the output of the chopper type comparator $C_{R1}$ is low and the outputs of the chopper type comparators $C_{R2}$–$C_{Rm}$ are high, the switching means $S_{11}$–$S_{1n}$ are conductive, and the digital signal $D_{LSB0}$ of the least significant bit side is generated.

For example, in case the outputs of the chopper type comparator $C_{R1}$–$C_{Rm}$ are low, the switching means $S_{m1}$–$S_{mn}$ are in a conductive means, and the digital signal $D_{LSB0}$ of the least significant bit side is generated.

In the half-flash type analog/digital converter of FIG. 1, the digital signal $D_{LSB0}$ and the digital signal $D_{LSB1}$ of the least significant bit side are used in alternating fashion for high-speed processing, and one of the digital signals of the least significant bit side and the digital signal $D_{MSB}$ of the most significant bit side are simultaneously output, so that an output signal of the half-flash type analog/digital converter is obtained.

FIG. 2 is a circuit diagram showing a conventional chopper type comparator used in the half-flash type analog/digital converter of FIG. 1. FIG. 3 is a circuit diagram showing a detailed example of the chopper type comparator of FIG. 2.

23 is the supply terminal for a power supply voltage $V_{CC}$. 22 is an output terminal. GND is ground potential. PTr is a P channel type field-effect transistor. NTr is a N-channel type field-effect transistor.

The reference voltage $V_{REF}$ is supplied to the input terminal 21, and the analog input signal $A_{IN}$ is supplied to the input terminal 20.

The chopper type comparator has: a first switching means SW1 for interrupting the reference voltage $V_{REF}$; a second switching means SW2 which is connected in parallel with said first switching means SW1 and interrupts the analog input signal $A_{IN}$ in comparative symmetry; a first capacitor C1 in which one terminal is connected to a connecting point P with the above-mentioned second switching means SW2; a first inverter INV1 in which the input terminal is connected to the other terminal of the above-mentioned first capacitor C1; a third switching means SW3 interposed between the output terminal and the input terminal of the above-mentioned first inverter INV1; a second capacitor C2 in which one terminal is connected to the output terminal of the above-mentioned first inverter INV1; a second inverter INV2 in which the input terminal is connected to the other terminal of the above-mentioned second capacitor C2; a fourth switching means SW4 interposed between the output terminal and the input terminal of the above-mentioned second inverter INV2; and a third inverter INV3 in which the input terminal is connected to the output terminal of the above-mentioned second inverter INV2.

The third inverter INV3 outputs an output signal $V_{OUT}$.

FIG. 4 is a timing diagram explaining an example of the operation of each switching means SW1–SW4 of the chopper type comparator of FIG. 2.

First, when the analog input period $T_A$ of the timing diagram starts, the switching means SW2 and SW3 are set to conductive, and an analog input signal $A_{IN}$ is input. Then, the capacitor C1 is charged, and the switching means SW4 is set to conductive with a slight delay.

In case the switching means SW2 and SW3 are conductive, since the input and output terminals of the inverters INV1 and INV2 are short-circuited, the voltage of the input and output terminals is ½ of the power supply voltage $V_{CC}$ of the inverters INV1 and INV2.

When the analog input period $T_A$ has ended, the switching means SW2 is nonconductive.

Next, the switching means SW3 is set to conductive from nonconductive for the holding period $T_H$, and the switching means SW4 is then set to nonconductive from conductive, so that all the switching means SW1–SW4 are set to nonconductive. In this way, the voltage level of the analog input signal $A_{IN}$ is held to the capacitor C1.

Next, the switching means SW1 is set to conductive for a reference voltage input period $T_V$, and the reference voltage $V_{REF}$ is input.

Thus, a prescribed voltage corresponding to the difference of the voltage level of the analog input signal $A_{IN}$ and the reference voltage $V_{REF}$ is applied to the capacitor C1, so that the prescribed voltage is amplified by the inverter INV1.

Then, the comparison result is output as the output signal $V_{OUT}$ to the output terminal 22 via the next capacitor C2 and inverters INV2 and INV3.

The analog input period $T_A$, holding period $T_H$, and reference voltage input period $T_V$ are repeated in order, and the analog input signal $A_{IN}$ and the reference voltage $V_{REF}$ are successively compared. The output signal $V_{OUT}$ showing the comparison result is then output.

Since the chopper type comparator has a capacitor and charges and discharges the capacitor, a prescribed time is required charging and discharging in terms of the relationship of the time constant.

For this reason, in case the period is short, that is, in case a high-speed operation is carried out, the time for charging the capacitor C1 by the analog input signal $A_{IN}$ is insufficient, and the voltage level different from the voltage level of the analog input signal $A_{IN}$ is held.

Also, the output voltage $V_{OUT}$ is output in a state in which the charging and discharging time of the capacitor C2 is insufficient.

Furthermore, it is necessary to input the analog input signal $A_{IN}$ after the comparison in terms of operation of the chopper type comparator, and if the operation period is shortened, the analog input signal $A_{IN}$ is input before the voltage corresponding to the comparison result is held by the capacitor C2, that is, before the capacitor C2 is completely reset. In this case, the voltage being held by the capacitor C1 is a voltage different from the voltage of the analog input signal $A_{IN}$.

Thus, an offset voltage is generated in the chopper type comparator, so that the offset voltage is also generated in the half-flash type analog/digital converter.

In particular, in the half-flash type analog/digital converter, the reference voltage of the chopper type comparator of the least significant bit side is changed by switching the switching means of the voltage divider.

For example, in FIG. 1, case switching means $S_{11}$–$S_{1n}$ of the voltage divider 105 are set to nonconductive from conductive and the switching means $S_{m1}$–$S_{mn}$ are set to conductive from nonconductive, the reference voltage of the chopper type comparators $C_{11}$–$C_{1n}$ of the least significant bit side is changed.

FIG. 5 is a voltage waveform diagram showing the voltage waveform of each of the chopper type comparators of FIG. 2. It shows an example of the voltage waveform of the input terminal 21 of the reference voltage $V_{REF}$ of the chopper type comparator and the connecting point P between the switching means SW1 and SW2.

In the voltage waveform diagram, for convenience of explanation, the analog input signal $A_{IN}$ is set to a fixed value of 1.6 V, and the reference voltage $V_{REF}$ varies.

The reference voltage $V_{REF}$ varies from 1.46 V to 1.74 V when the time T is 250 nS.

$V_R$ is the input terminal voltage of the reference voltage $V_{REF}$ of the chopper type comparator, and $V_P$ is the voltage of the connecting point P.

In the voltage waveform diagram of FIG. 5, when the analog input signal $A_{IN}$ is input and the voltage level is held, the step difference of the voltage corresponding to about 1.3 LSB is generated in the voltage $V_P$ before and after switching the reference voltage $V_{REF}$.

An incomplete reset of the capacitor 2 is considered to be the largest cause of the step difference (noise) of the voltage. In case the operation period of the chopper type comparator is short, if the holding operation of the analog input signal $A_{IN}$ is carried out before the reset operation of the capacitor 2 is completed, the holding voltage of the capacitor C1 is changed by electric charges remaining in the capacitor C2.

As shown in FIG. 5, when the reference voltage $V_{REF}$ varies, since the output of the chopper type comparator is reversed, the voltage (charge) held to both terminals of the capacitor C2 is also reversed. Therefore, in case the operation period of the chopper type comparator is short, since the analog input signal $A_{IN}$ is held in a state in which the reset operation of the capacitor C2 is not completely carried out, the reversed voltage (charge) remaining in the above-mentioned capacitor C2 has an influence on the holding voltage, and a shift (step difference) of the holding voltage as shown in FIG. 5 is generated.

In other words, since the size of the reference voltage $V_{REF}$ varies before and after switching of the switching means of the voltage divider 105, the size of the offset varies according the influence so that it is difficult to operate the half-flash type analog/digital converter at high speed.

The purpose of the present invention is to provide a chopper type comparator that can be operated at higher speed, compared with the conventional type.

SUMMARY OF THE INVENTION

The chopper type comparator of the present invention is characterized by the fact that it has: a first switching means connected between a reference voltage input terminal and a first node; a second switching means connected between an analog signal input terminal and the above-mentioned first node; a first capacitor in which one electrode is connected to the above-mentioned first node; a first inverter in which an input terminal is connected to the other electrode of the above-mentioned first capacitor; a second capacitor in which one electrode is connected to the output terminal of the above-mentioned first inverter; a second inverter in which the input terminal is connected to the other electrode of the above-mentioned second capacitor; a third switching means connected between the input terminal and the output terminal of the above-mentioned first inverter; a fourth switching means connected between the input terminal and the output terminal of the above-mentioned second inverter; and a fifth switching means connected between one electrode and the other electrode of the above-mentioned second capacitor. When the above-mentioned second, third, fourth, and fifth switching means are simultaneously conductive, an analog signal input period starts; when the above-mentioned second switching means is nonconductive, a holding period starts; the above-mentioned third, fourth, and fifth switching means are nonconductive for said holding period; when the above-mentioned first switching means is conductive, a reference voltage input period starts, so that the comparison result of the analog signal and the reference voltage is output.

In the chopper type comparator of the present invention, since the fifth switching means is installed between one electrode and the other electrode of the second capacitor and the fourth switching means and the fifth switching means connected between the input terminal and the output terminal of the second inverter are simultaneously conductive, the second capacitor can be reset in a short time, so that the comparison time of the chopper type comparator is reduced.

Figure 1:
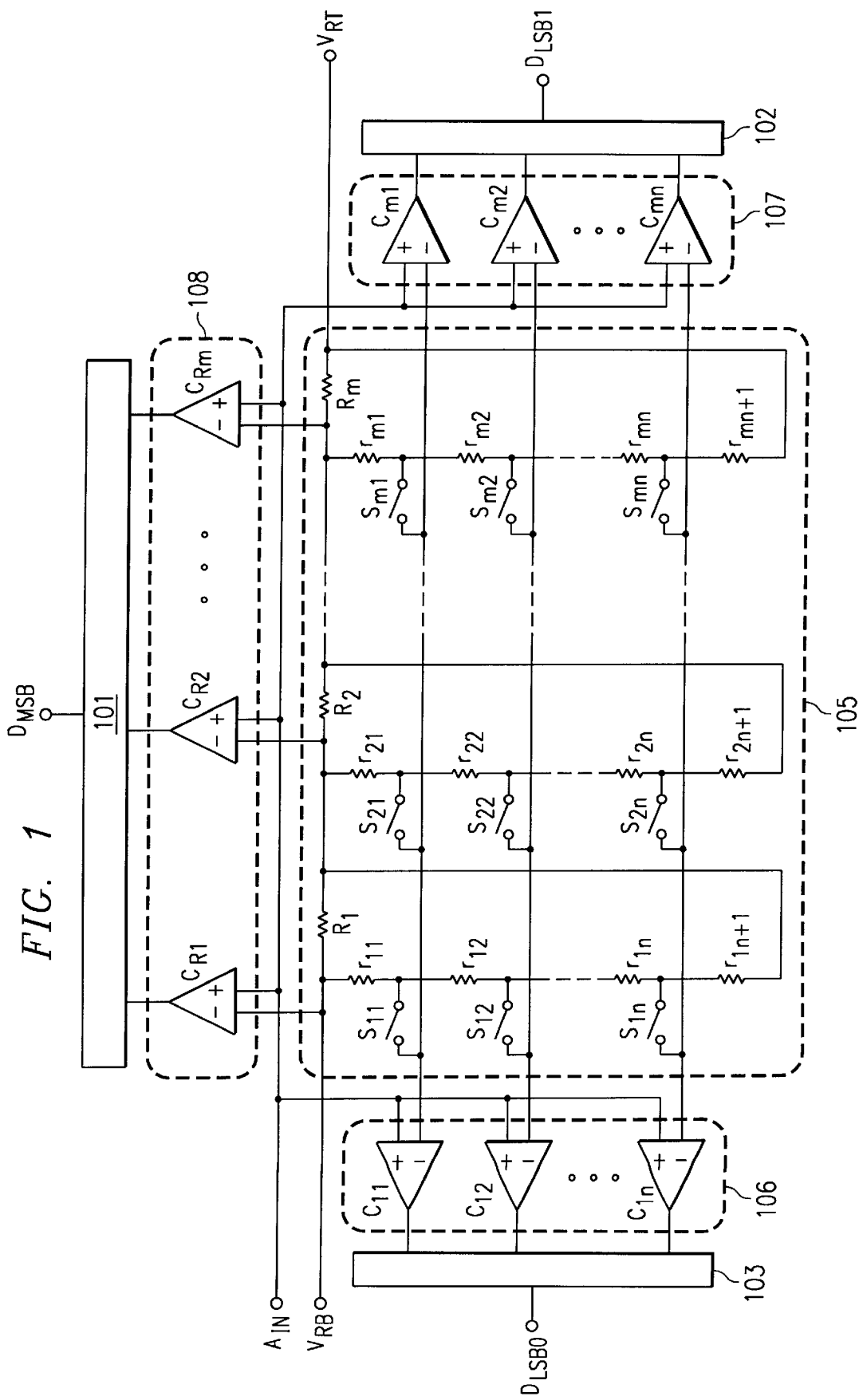
FIG. 1 is a constitutional diagram showing an example of a conventional half-flash type analog/digital converter.
Figure 2:
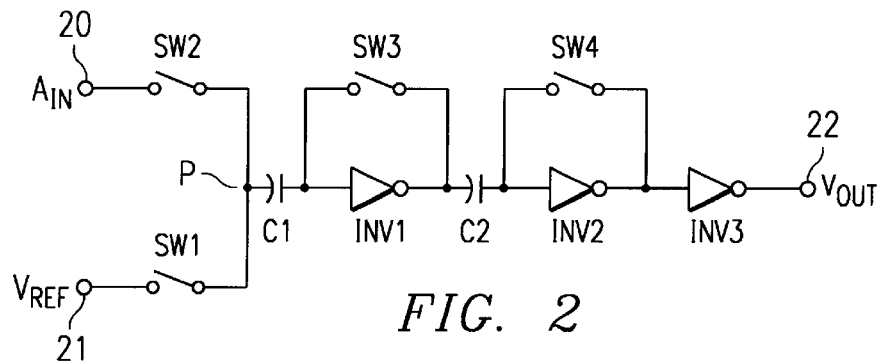
FIG. 2 is a circuit diagram showing a conventional chopper type comparator.
Figure 3:
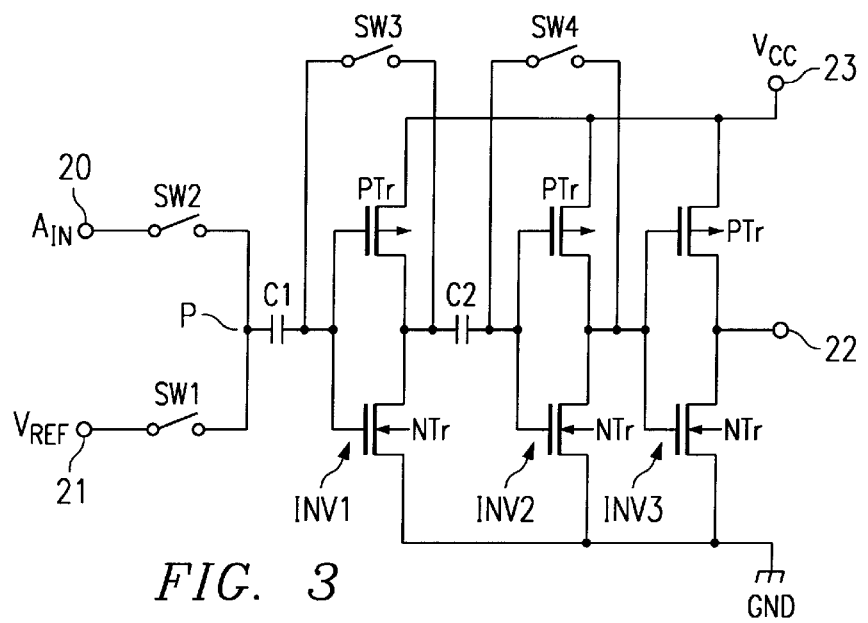
FIG. 3 is a circuit diagram showing a conventional chopper type comparator.

REFERENCE NUMERALS AND SYMBOLS AS SHOWN IN THE DRAWINGS 2, 3 Tristate inverters; 20 Input terminal (analog signal input terminal); 21 Input terminal (reference voltage input terminal); 22 Output terminal; 23 Supply voltage of the power supply voltage $V_{CC}$; 101, 102, 103 Encoders; 105 Voltage divider; 106, 107, 108, 116, 117, 118 Chopper type comparator groups; $A_{IN}$ Analog input signal; $B_{11}$–$B_{1n}$, $B_{m1}$–$B_{mn}$, $B_{R1}$–$B_{Rm}$, $C_{11}$–$C_{1n}$, $C_{m1}$–$C_{mn}$, $C_{R1}$–$C_{Rm}$; Chopper type comparators; $D_{LSB0}$, $D_{LSB1}$ Digital signals of the least significant bit side; $D_{MSB}$ Digital signal of the most significant bit side; IV, INV1–INV3 Inverters; NTr N-channel type field-effect transistor (N-type field-effect transistor); PTr P-channel type field-effect transistor (P-type field-effect transistor); PConnecting point (first node) of the switching means SW1 and the switching means SW2; $R_1$–$R_m$, $r_{11}$–$r_{1n+1}$, $r_{21}$–$r_{2n+1}$, $r_{m1}$–$r_{mn+1}$ Resistors; $S_{11}$–$S_{1n}$, $S_{21}$–$S_{2n}$, $S_{m1}$–$S_{mn}$, SW1–SW5 Switching means; Sc Control signal $T_A$ Analog input period (analog signal input period); $T_H$ Holding period; $T_V$ Reference voltage input period (reference voltage input period); $V_{CC}$ Power supply voltage; $V_{OUT}$ Output voltage; $V_P$ Potential of the connecting point P; $V_R$ Potential of the input terminal 21; $V_{RS}$, $V_{RT}$ Voltages; $V_{REF}$ Reference voltage;

DESCRIPTION OF THE EMBODIMENT

Next, an embodiment of the present invention is explained by referring to the attached figures.

Figure 6:
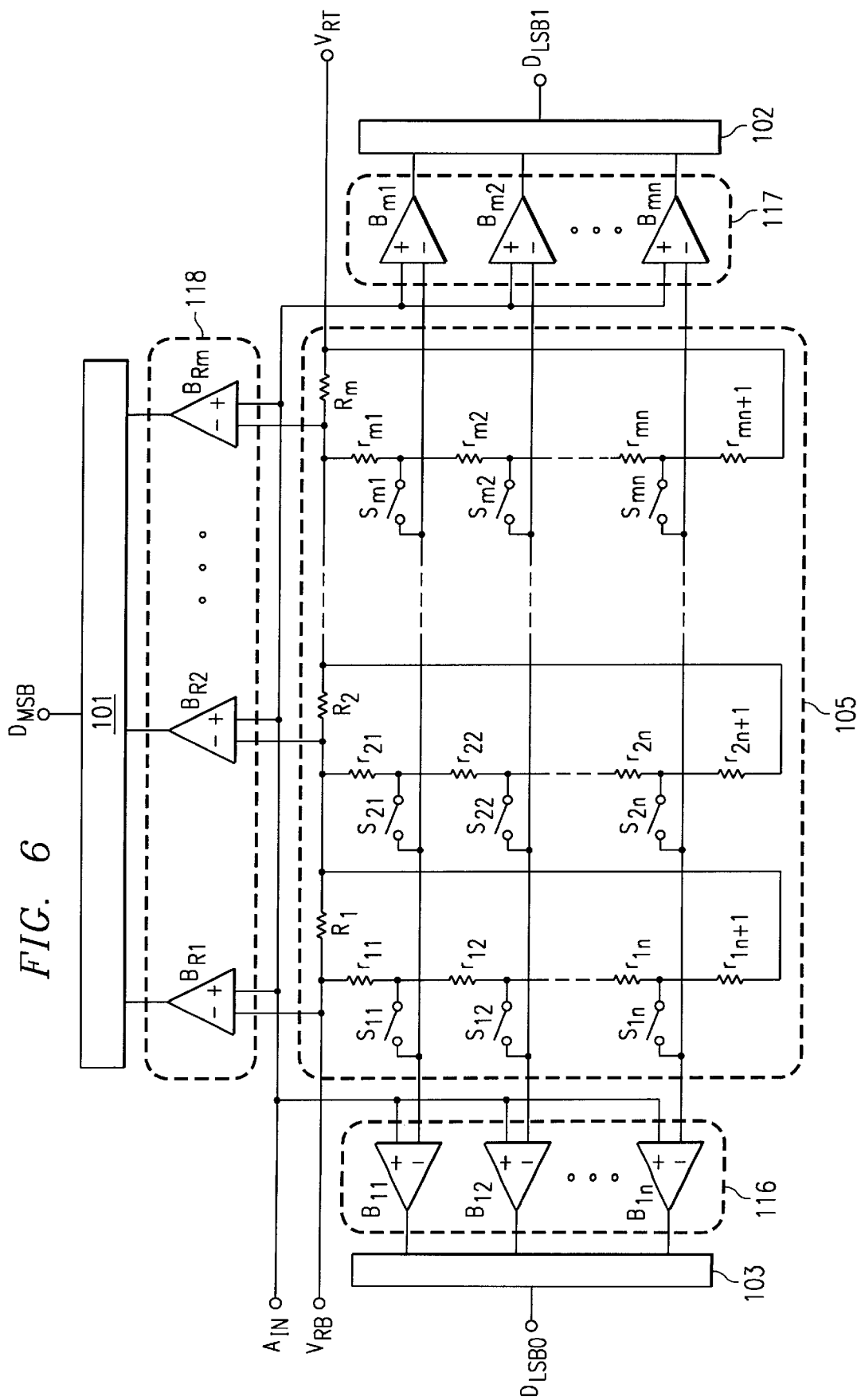
FIG. 6 is a constitutional diagram showing an example of the half-flash type analog/digital converter of the present invention.

FIG. 6 is a constitutional diagram showing an example of the half-flash type analog/digital converter of the present invention.

The half-flash type analog/digital converter has: a voltage divider 105 that receives the voltages $V_{RB}$ and $V_{RT}$ and generates reference voltages for comparison by dividing the differential voltages, chopper type comparator groups 116–118 for comparing reference voltages from the voltage divider 105 and analog input signals $A_{IN}$; an encoder 103 for outputting the digital signals $D_{LSB0}$ of the least significant bit side based on the output result of the chopper type comparator group 116; an encoder 102 for outputting digital signals $D_{LSB1}$ of the least significant bit side based on the output result of the chopper type comparator group 117; and an encoder 101 for outputting digital signals $D_{MSB}$ of the most significant bit side based on the output result of the chopper type comparator group 118.

The voltage divider 105 has resistors $R_1$–$R_m$ connected in series for dividing the reference voltage consisting of a differential voltage of voltage $V_{RB}$ and voltage $R_{RT}$.

Resistors $r_{11}$–$r_{1n}$ and $r_{1n+1}$, connected in series for further dividing the terminal voltage of the resistor $R_1$, are connected in parallel with resistor $R_1$.

Resistors $r_{21}$–$r_{2n}$ and $r_{2n+1}$, connected in series for further dividing the terminal voltage of the resistor $R_2$, are connected in parallel with resistor $R_2$.

The resistors $R_3$–$R_{m-1}$ are also similar.

Resistors $r_{m1}$–$r_{mn}$ and $r_{mn+1}$, connected in series for further dividing the terminal voltage of the resistor $R_m$, are connected in parallel with resistor $R_m$.

One terminal of the resistor $r_{M1}$ is connected to one terminal of the resistor $R_M$, and the other terminal of the resistor $r_{M1}$ is connected to the inverting input terminal of a chopper type comparator $B_{11}$ via a switching means $S_{M1}$.

One terminal of the resistor $r_{M2}$ is connected to the other terminal of the resistor $R_{M1}$, and the other terminal of the resistor $r_{M2}$ is connected to the inverting input terminal of a chopper type comparator $B_{12}$ via a switching means $S_{M2}$.

The resistors $r_{M3}$–$r_{Mn-1}$ are also similar.

One terminal of the resistor $r_{Mn}$ is connected to the other terminal of the resistor $r_{Mn-1}$, and the other terminal of the resistor $r_{Mn}$ is connected to the inverting input terminal of the chopper type comparator $B_{1n}$ via the switching means $S_{Mn}$, where $1 \leq M \leq m$, and M and m are integers of 2 or higher.

The inverting input terminals of the chopper type comparators $B_{11}$–$B_{1n}$ and the inverting input terminals of the chopper type comparators $B_{m1}$–$B_{mn}$ are respectively connected.

The analog input signal $A_{IN}$ is supplied to the non-inverting input terminal of the chopper type comparators $B_{11}$–$B_{1n}$, $B_{m1}$–$B_{mn}$, and $B_{R1}$–$B_{Rm}$.

Terminals of the resistors $R_1$–$R_m$ are respectively connected to the inverting input terminals of the chopper type comparators $B_{R1}$–$B_{Rm}$.

The chopper type comparator groups 116 and 117 respectively have the chopper type comparators $B_{11}$–$B_{1n}$ and $B_{m1}$–$B_{mn}$ of the least significant bit side.

The chopper type comparator group 118 has the chopper type comparator $B_{R1}$–$B_{Rm}$ of the most significant bit side.

Based on the outputs of the chopper type comparators $B_{R1}$–$B_{Rm}$ of the most significant bit side, the switching means $S_{11}$–$S_{1n}$, etc., $S_{m1}$–$S_{mn}$ of the voltage divider 105 are controlled.

For example, in case the output of the chopper type comparator $B_{R1}$ is low and the outputs of the chopper type comparators $B_{R2}$–$B_{Rm}$ are high, the switching means $S_{11}$–$S_{1n}$ are conductive, and the digital signal $D_{LSB0}$ of the least significant bit side is generated.

For example, in case the outputs of the chopper type comparator $B_{R1}$–$B_{Rm}$ are low, the switching means $S_{m1}$–$S_{mn}$ are in a conductive means, and the digital signal $D_{LSB0}$ of the least significant bit side is generated.

In the half-flash type analog/digital converter of FIG. 6, the digital signal $D_{LSB0}$ and the digital signal $D_{LSB1}$ of the least significant bit side are used in alternating fashion for high-speed processing, and one of the digital signals of the least significant bit side and the digital signal $D_{MSB}$ of the most significant bit side are simultaneously output, so that an output signal of the half-flash type analog/digital converter is obtained.

Figure 7:
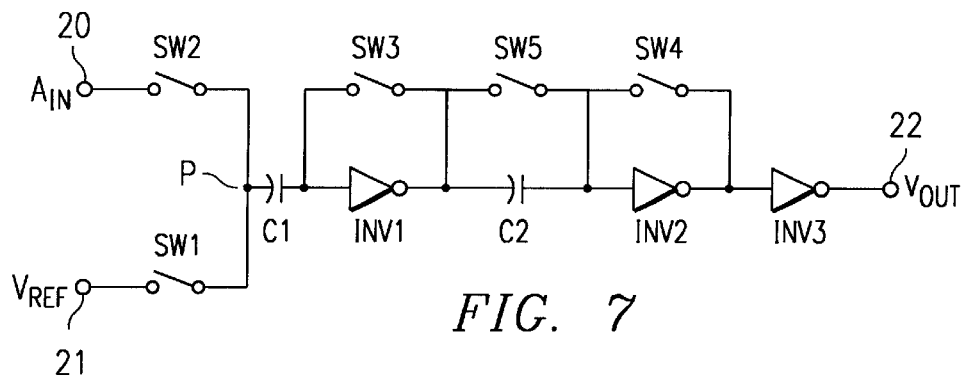
FIG. 7 is a circuit diagram showing an example of the chopper type comparator of the present invention.

FIG. 7 is a circuit diagram showing the chopper type comparator of the present invention being used in the half-flash type analog/digital converter of FIG. 6.

20 is an input terminal of the analog input signal $A_{IN}$. 21 is an input terminal of the reference voltage $V_{REF}$. 22 is an output terminal of the output signal $V_{OUT}$.

The chopper type comparator has a first switching means SW1 for interrupting the reference voltage $V_{REF}$, a second switching means SW2 which is connected in parallel with said first switching means SW1 and interrupts the analog input signal $A_{IN}$ in comparative symmetry, a first capacitor C1 in which one terminal is connected to a connecting point P with the above-mentioned second switching means SW2, a first inverter INV1 in which the input terminal is connected to the other terminal of the above-mentioned first capacitor C1, a third switching means SW3 being interposed between the output terminal and the input terminal of the above-mentioned first inverter INV1, a second capacitor C2 in which one terminal is connected to the output terminal of the above-mentioned first inverter INV1, a second inverter INV2 in which the input terminal is connected to the other terminal of the above-mentioned second capacitor C2, a fourth switching means SW4 being interposed between the output terminal and the input terminal of the above-mentioned second inverter INV2, a third inverter INV3 in which the input terminal is connected to the output terminal of the above-mentioned second inverter INV2, and a fifth switching means SW5 being interposed between one terminal and the other terminal of the above-mentioned second capacitor.

The third inverter INV3 outputs the output signal $V_{OUT}$.

Figure 8:
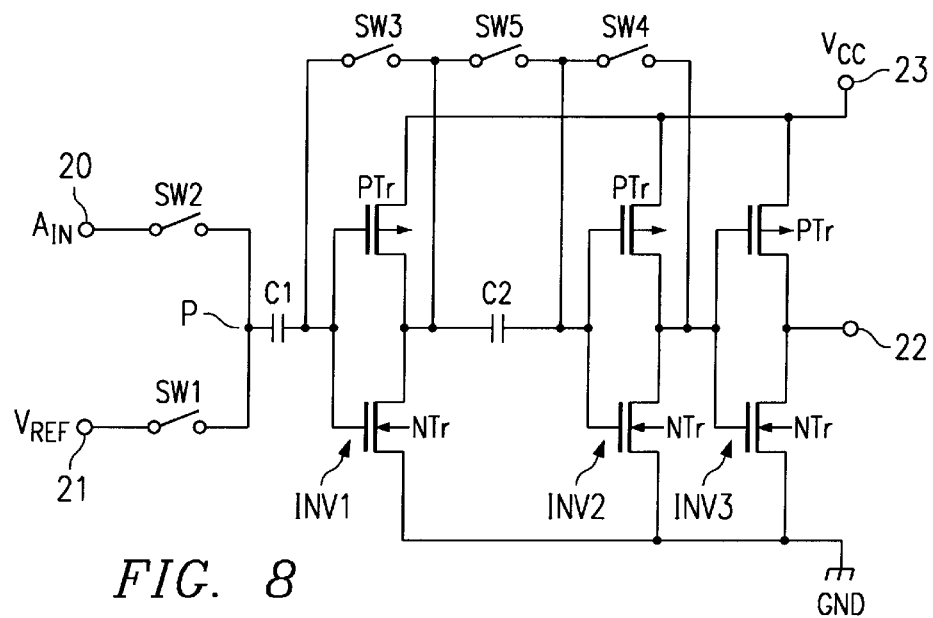
FIG. 8 is a circuit diagram showing an example of the chopper type comparator of the present invention.

FIG. 8 is an embodied circuit example of the chopper type comparator of FIG. 7, and the inverters INV1–INV3 of FIG. 7 are constituted by a CMOS (Complementary Metal Oxide Semiconductor) circuit.

Figure 9:
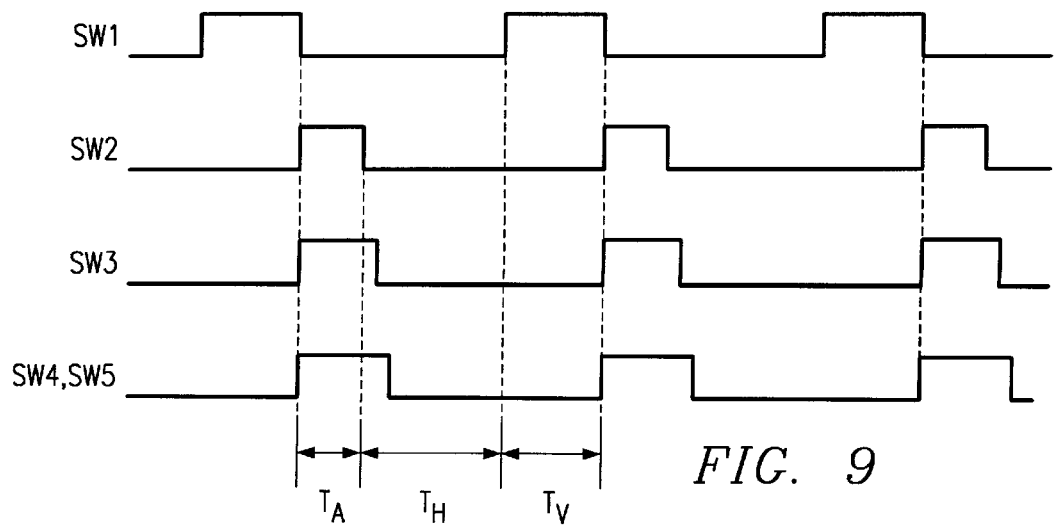
FIG. 9 is a timing diagram for explaining an operational example of each switching means of the chopper type comparator of FIG. 7.

FIG. 9 is a timing diagram for explaining an example of the operation of each switching means SW1–SW5 of the chopper type comparator of FIG. 7.

The first to fifth switching means SW1–SW5 are respectively controlled so that when the first switching means SW1 is conductive, the above-mentioned second to fifth switching means SW2–SW5 are respectively nonconductive, that when the first switching means SW1 is switched to nonconductive, the second to fifth switching means SW2–SW5 are conductive, that the second to fifth switching means SW2–SW5 are respectively nonconductive until the first switching means SW1 is switched to conductive, and that after the third switching means SW3 is switched to nonconductive, the fourth and fifth switching means SW4 and SW5 are simultaneously nonconductive.

Figure 4:
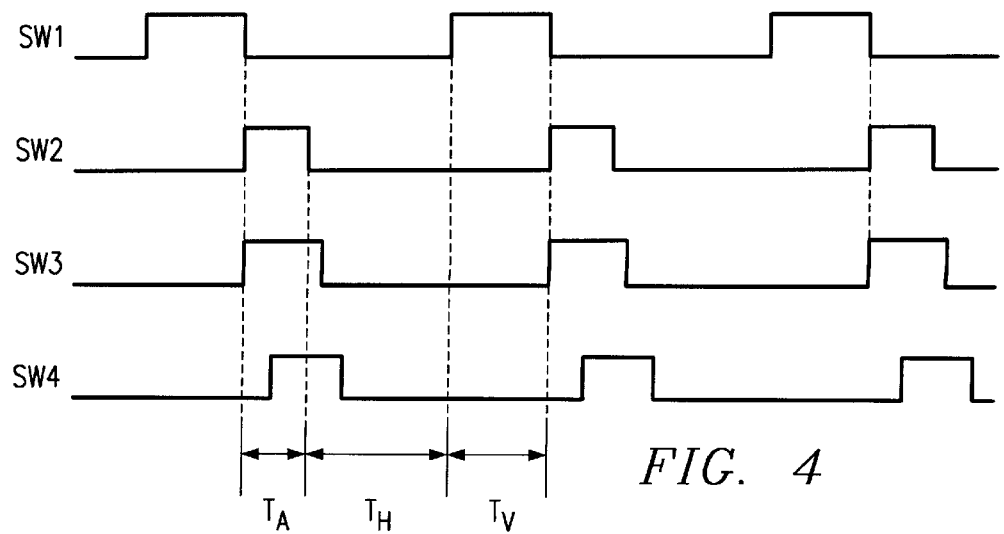
FIG. 4 is a timing diagram for explaining an operational example of each switching means of the chopper type comparator of FIG. 2.

In the timing diagram of FIG. 9, unlike the timing diagram of FIG. 4, when the switching means SW2 is conductive and the analog input signal $A_{IN}$ is input, the respective switching means SW3–SW5 and the switching means SW2 are simultaneously switched to conductive.

In FIG. 9, when the analog input period $T_A$ starts, the switching means SW2–SW5 are set to conductive, the analog input signal $A_{IN}$ is input, and the capacitor C1 is charged.

When the analog input period $T_A$ has ended, the switching means SW2 is nonconductive.

Next, for the holding period $T_H$, the switching means SW3 is switched from conductive to nonconductive, and the voltage level corresponding to the analog input signal $A_{IN}$ is held by the capacitor C1.

Then, the switching means SW4 and SW5 are switched from conductive to nonconductive, so that all of the switching means SW1–SW5 are set to nonconductive.

Also, when the analog input signal is input, the switching means SW4 and SW5 are set to conductive, so that the capacitor C2 is reset in a short time. Thereby, the electric charges due to the previous comparison result are discharged in a short time from the capacitor C2.

Since the terminal voltage of the capacitor C2 and the output voltage of the INV2 have an inverse relationship, from this point of view, the capacitor C2 is also reset in a short time by setting the switching means SW4 and SW5 to conductive.

The switching means SW4 and SW5 are nonconductive, charging of the capacitor 2 is started based on the output of the inverter INV1.

Next, the switching means SW1 is set to conductive for the reference voltage input period $T_V$, and the reference voltage $V_{REF}$ is input.

Thus, a prescribed voltage is input corresponding to the difference of the voltage level of the analog input signal $A_{IN}$ and the reference voltage $V_{REF}$, so that the prescribed voltage is amplified by the inverter INV1.

Then, the comparison result is output as the output voltage $V_{OUT}$ via the next capacitor C2 and inverters INV2 and INV3.

The analog input period $T_A$, holding period $T_H$, and reference voltage input period $T_V$ are repeated in order, and the output voltage $V_{OUT}$ showing the comparison result is then output.

Figure 10:
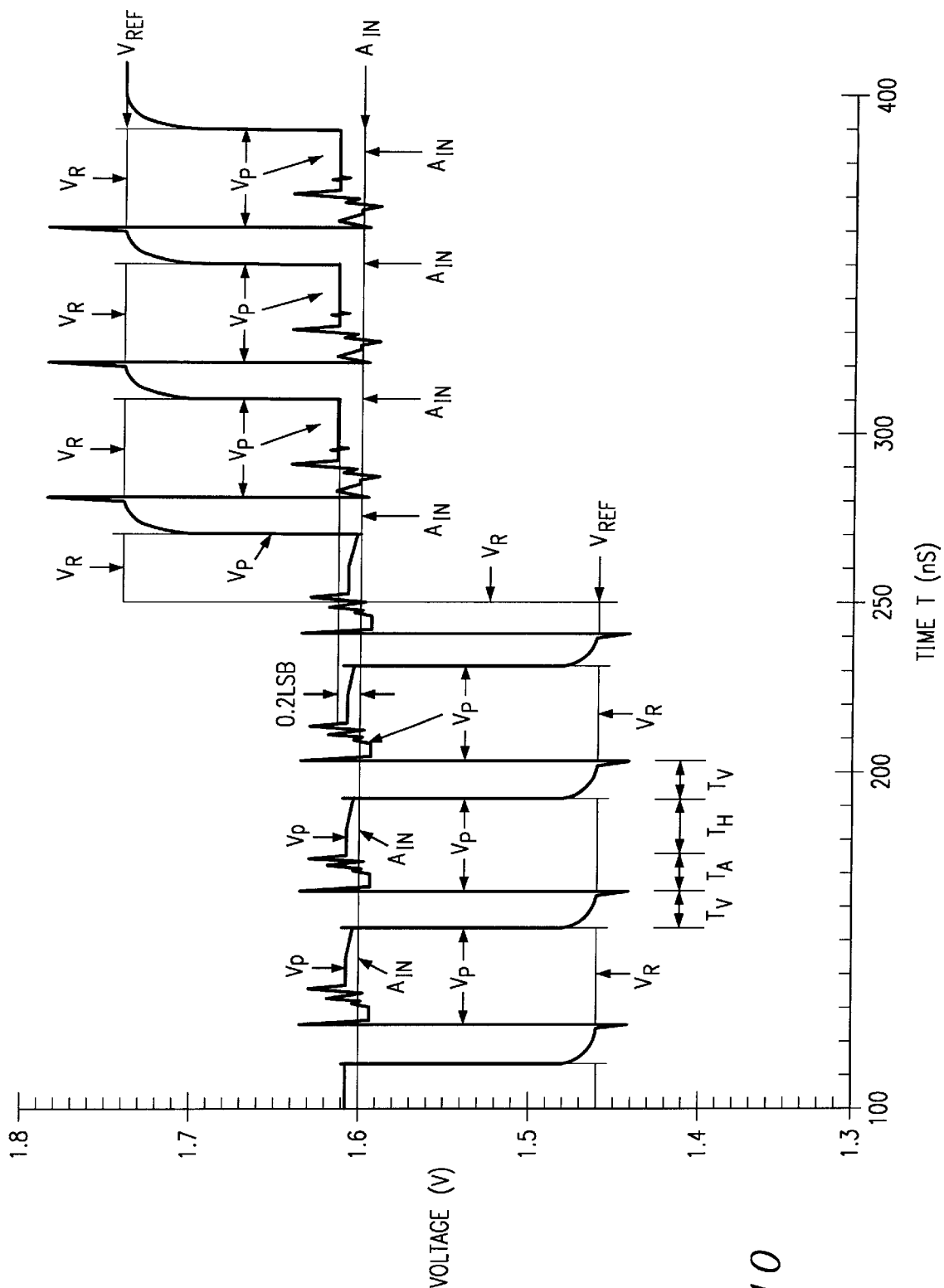
FIG. 10 is a voltage waveform diagram showing an example of the voltage waveform of each part of the chopper type comparator of FIG. 7.

FIG. 10 is a voltage waveform diagram showing an example of the voltage waveform of the chopper type comparator of FIG. 7.

In the voltage waveform diagram, for convenience of explanation, the analog input signal $A_{IN}$ is set to a fixed value of 1.6 V, and the reference voltage $V_{REF}$ varies.

The reference voltage $V_{REF}$ varies from 1.46 V to 1.74 V when the time T is 250 ns (nano second).

$V_R$ is the terminal voltage of the input terminal 21 of the reference voltage $V_{REF}$, and $V_P$ is the voltage of the connecting point P.

Figure 5:
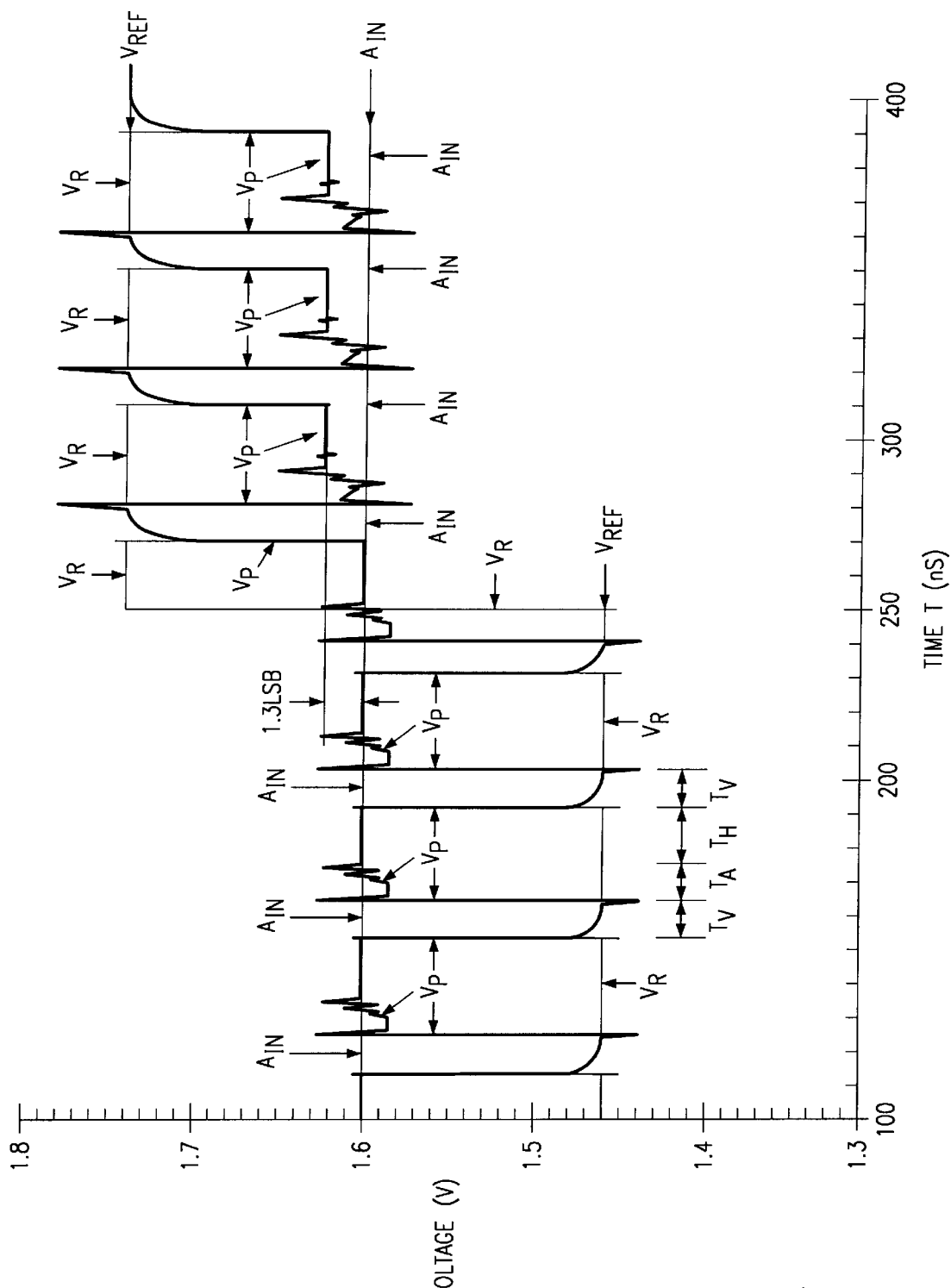
FIG. 5 is a voltage waveform diagram showing an example of the voltage waveform of each part of the chopper type comparator of FIG. 2.

In FIG. 10, when the analog input signal $A_{IN}$ is input and the voltage level is held by the capacitor C1, the step difference of about 0.2 LSB is generated before and after switching of the reference voltage $V_{REF}$; however, the step difference of the voltage $V_P$ is smaller and improved, compared with the voltage waveform diagram of FIG. 5.

Therefore, the offset voltage of the chopper type converter of FIG. 7 and the half-flash type analog/digital converter using the comparator can be reduced, compared with the conventional type.

Also, since the capacitor C2 is reset in a short time, the chopper type comparator of FIG. 7 and the half-flash type analog/digital converter using the comparator can be operated at higher speed, compared with the conventional type.

In FIG. 7, since the signal levels of the input terminal and the output terminal of the inverter INV2 are mutually inverse after the conversion and output, the input terminal and the output terminal of the inverter INV2 are short-circuited by simultaneously setting the switching means SW4 and SW5 to conductive, so that the capacitor C2 is reset at high speed.

A detailed circuit example of the switching means SW1–SW5 of the chopper type comparator of FIG. 7 is shown in FIG. 11.

Figure 11A:
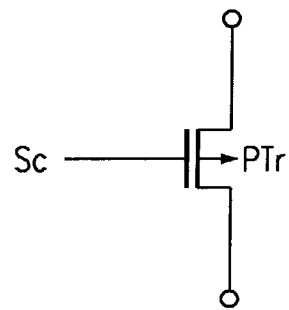
FIG. 11 is a detailed circuit example showing the switching means.

As the switching means SW1–SW5, as shown in FIG. 11(A), an n-channel type field-effect transistor NTr may also be used. Sc is a control signal for the switching means.

Figure 11B:
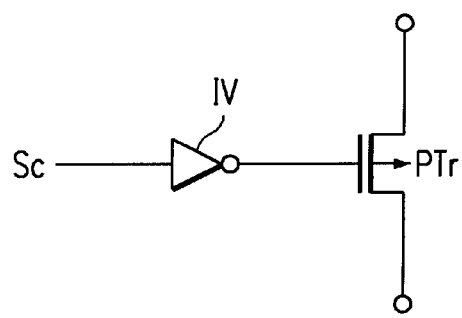

As the switching means SW1–SW5, as shown in FIG. 11(B), a P-channel type field-effect transistor and an inverter IV may also be used.

The control signal Sc is supplied to the input terminal of the inverter IV, and the output terminal of the inverter IV is connected to the gate of the P channel type field-effect transistor PTr.

Figure 11C:
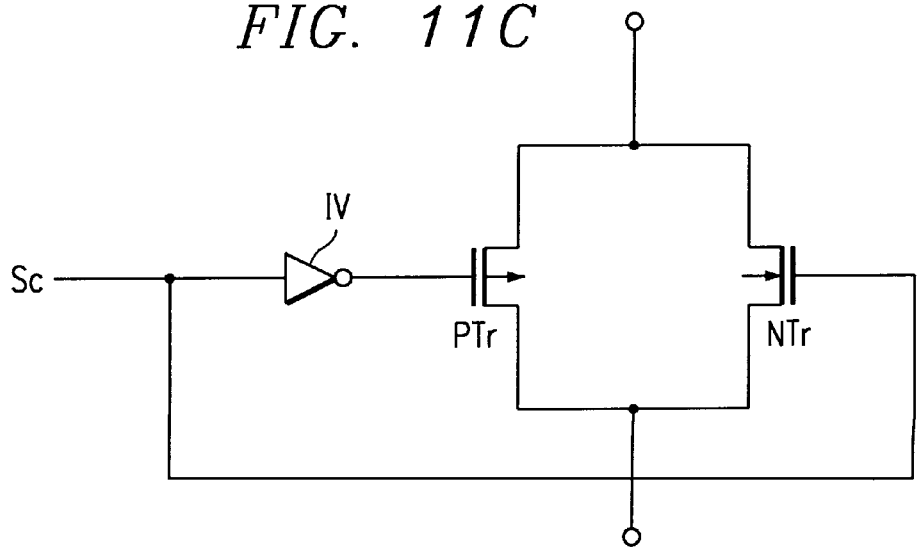

As the switching means SW1–SW5, as shown in FIG. 11(C), the P-channel type field-effect transistor PTr, N channel type field-effect transistor NTr, and inverter IV may also be used.

The control signal Sc is supplied to the input terminal of the inverter IV, and the output terminal of the inverter IV is connected to the gate of the P-channel type field-effect transistor PTr.

The control signal Sc is supplied to the gate of the N-channel type field-effect transistor NTr.

The drain of the P-channel type field-effect transistor PTr is connected to the source of the N-channel type field-effect transistor NTr.

The drain of the N-channel type field-effect transistor NTr is connected to the source of the P-channel type field-effect transistor PTr.

The half-flash type analog/digital converter of the present invention may also be constituted so that the chopper type comparator group 117 and the encoder 102 are removed from the half-flash type analog/digital converter of FIG. 6.

The half-flash type analog/digital converter of the present invention may also be formed as a semiconductor device, the electrostatic capacitance of the first capacitor C1 may also be about $180 \times 10^{-15}$ F, and the electrostatic capacitance of the second capacitor C2 may also be about $60 \times 10^{-15}$ F.

The half-flash type analog/digital converter of FIG. 6 is constituted so that it outputs a digital signal of N bits, assuming N to be an even number, and determines the value of the most significant bit side N/2 bit as the digital signal $D_{MSB}$, and the circuit may also be constituted so that it selects the switching means of the voltage divider 105 based on the result of the digital signal $D_{MSB}$ and determines the value of the least significant bit side N/2 bit.

Also, the above-mentioned embodiment is an example of the present invention, and the present invention is not limited to the above-mentioned embodiment.

In the chopper type comparator of the present invention, when an analog input signal is input, since the second capacitor in the chopper type comparator can be reset at high speed, the operation speed of the chopper type comparator can be improved.

In the half-flash type analog/digital converter of the present invention, when an analog input signal is input, since the second capacitor of the chopper type comparator is reset at high speed, the operation speed of the chopper type comparator can be improved, so that the operation speed of the analog/digital conversion can be improved.

Also, in the half-flash type analog/digital converter, the reference voltage of the chopper type comparator of the least significant bit side is changed, however since the second capacitor of the chopper type comparator is reset at high speed, the offset voltage of the chopper type comparator can be reduced, so that the precision of the analog/digital conversion can be improved.

What is claimed is:

1. A chopper type comparator comprising a first switching means connected between a reference voltage input terminal and a first node, a second switching means connected between an analog signal input terminal and the first node, a first capacitor in which one electrode is connected to the first node, a first inverter in which an input terminal is connected to the other electrode of the first capacitor, a second capacitor in which one electrode is connected to the output terminal of the first inverter, a second inverter in which the input terminal is connected to the other electrode of the second capacitor, a third switching means connected between the input terminal and the output terminal of the first inverter, a fourth switching means connected between the input terminal and the output terminal of the second inverter, and a fifth switching means connected between one electrode and the other electrode of the second capacitor; that when the second, third, fourth, and fifth switching means are simultaneously conductive, an analog signal input period starts; that when the second switching means is nonconductive, a holding period starts; and that the third, fourth, and fifth switching means are nonconductive for said holding period; that when the first switching means is conductive, a reference voltage input period starts, so that the comparison result for the analog signal and the reference voltage is output.

2. The chopper type comparator of claim 1 further comprising a third inverter in which the input terminal is connected to the output terminal of the above-mentioned second inverter.

3. The chopper type comparator of claim 1 wherein when the third switching means is nonconductive, the fourth and fifth switching means are simultaneously nonconductive.

4. The chopper type comparator of claim 2 wherein the first, second, and third inverters are constituted by a p-type field-effect transistor and an n-type field-effect transistor; that the first, second, third, fourth, and fifth switching means are constituted by the field-effect transistors.

5. The chopper type comparator of claim 3 wherein when the third switching means is nonconductive, the fourth and fifth switching means are simultaneously nonconductive.

6. The chopper type comparator of claim 4 wherein the first, second, and third inverters are constituted by a p-type field-effect transistor and an n-type field-effect transistor; that the first, second, third, fourth, and fifth switching means are constituted by the field-effect transistors.

* * * * *